United States Patent [19]
Fukuda

[11] Patent Number: 5,870,342
[45] Date of Patent: Feb. 9, 1999

[54] SEMICONDUCTOR MEMORY DEVICE SURELY RESET UPON POWER ON

[75] Inventor: Tatsuya Fukuda, Hyogo, Japan

[73] Assignee: Mitsubishi Denki Kabushiki Kaisha, Tokyo, Japan

[21] Appl. No.: 990,575

[22] Filed: Dec. 15, 1997

[30] Foreign Application Priority Data

Jun. 25, 1997 [JP] Japan ..................................... 9-168675

[51] Int. Cl.$^6$ ............................. G11C 7/00; G11C 16/04; G11C 8/00
[52] U.S. Cl. ...................... 65/201; 365/189.05; 365/226; 365/230.08
[58] Field of Search .............................. 365/201, 189.05, 365/189.08, 226, 230.08, 233; 327/535, 538

[56] References Cited

U.S. PATENT DOCUMENTS

| | | | |
|---|---|---|---|
| 5,204,837 | 4/1993 | Suwa et al. ............................... | 365/201 |
| 5,270,977 | 12/1993 | Iwamoto et al. ......................... | 365/201 |
| 5,365,481 | 11/1994 | Sawada .................................... | 365/201 |
| 5,469,402 | 11/1995 | Yamauchi et al. .................. | 365/189.05 |
| 5,530,397 | 6/1996 | Nakai et al. .............................. | 327/538 |
| 5,631,867 | 5/1997 | Akmatsu et al. ......................... | 365/226 |
| 5,732,034 | 3/1998 | Asakura et al. .......................... | 365/201 |

FOREIGN PATENT DOCUMENTS 3-194799  8/1991  Japan .

*Primary Examiner*—David Nelms
*Assistant Examiner*—Trong Phan
*Attorney, Agent, or Firm*—McDermott, Will & Emery

[57] ABSTRACT

A mode setting signal generating circuit activates mode setting signals in accordance with external signals. A test mode activating signal generating circuit takes in an externally applied address signal Add as the mode setting signals are activated, and drives a test mode activating signal to the active state in accordance with the state thereof. As power on detection signal from a power on detection circuit is activated, test mode activating signal is reset to the initial state, and a reset circuit holds the test mode activating signal at the inactive state, in accordance with imperfect activation of the power on detection signal. Internal state is prevented from erroneously set to a test mode state, even when power on detection signal is imperfectly generated at the time of power on.

16 Claims, 10 Drawing Sheets

W4 > W3 ,   W1 > W2   W4 > W1

5,870,342

SEMICONDUCTOR MEMORY DEVICE SURELY RESET UPON POWER ON

BACKGROUND OF THE INVENTION

1. Field of the Invention

The present invention relates to a semiconductor memory device and, more specifically, to a structure of a portion generating a test mode activating signal for placing the semiconductor memory device in a test mode. More specifically, the present invention relates to a structure for initializing the test mode activating signal generating portion at the time of power on.

2. Description of the Background Art

In semiconductor memory devices such as synchronous semiconductor memory devices, various tests are performed to ensure reliability of the products. Such tests include a screening test for revealing latent defects and screening out a defective product having initial failure at the time of marketing, and a multibit test mode for testing a plural bits of memory cells simultaneously for detecting absence/presence of defects of memory cells in a short period of time. The screening test has a burn in mode in which a semiconductor memory device is operated under a condition of higher temperature and higher voltage than the normal operating condition. These test modes are operation modes performed before marketing of the products, and these test modes are not utilized in a system which is actually used by a user.

When the semiconductor memory device enters a test mode in a system in which the semiconductor memory device is actually used, the internal state of the semiconductor memory device changes from the state in a normal operation mode, possibly causing malfunction. In order to prevent the semiconductor memory device from entering the test mode in actual use, generally, the test mode is set by a combination of states of a plurality of external signals which is not used in the normal operation mode in actual use. However, there are nodes of which initial output voltage cannot be determined in advance such as those in a latch circuit or a flipflop, or internal nodes which are floating, in the internal circuitry at the time of power on (at the start of application of power supply voltage to the semiconductor memory device). Therefore, the voltages of these internal nodes are non-predictable at the time of power on. In this case, if a timing condition allowing entrance to the test mode is met because of the voltage level of those nodes of which voltage levels are non-predictable (that is, of which voltage levels cannot be determined in advance after power on), the semiconductor memory device may possibly enter the test mode. In order to surely reset the non-predictable voltage levels of the internal nodes, a power on detection signal POR is used for resetting the non-predictable node(s) to a prescribed voltage level at the time of power on.

FIG. 13 schematically shows a structure of a conventional test mode activating signal generating circuit. Referring to FIG. 13, a test mode activating signal generating circuit 100 includes a tristate inverter buffer 100a which is enabled when mode set instructing signals MSET and ZMSET are activated, for inverting an externally applied specific address signal bit Add, buffering and transmitting it to an internal node NA, and a test mode activating signal output circuit 100b for outputting a test mode activating signal TME in accordance with the voltage of internal node NA and for latching the test mode activating signal TME when mode set instructing signals MSET and ZMSET are activated. Tristate inverter buffer 100a is set to an output high impedance state when mode set instructing signals MSET and ZMSET are inactivated.

Test mode activating signal output circuit 100b includes an inverter 100ba for inverting a signal on node NA for transmission to a node NB to generate test mode activating signal TME, and a tristate inverter buffer 100bb which is activated when mode set instruction signals MSET and ZMSET are activated, for transmitting a signal on node NB to node NA. Tristate inverter buffer 100bb is also set to an output high impedance state when mode set instructing signals MSET and ZMSET are inactivated.

Test mode activating signal generating circuit 100 further includes a p channel MOS transistor 102 responsive to activation of power on detection signal ZPOR for electrically connecting a power supply node NV to internal node NA. Power on detection signal ZPOR is kept at an active state of L level until the power supply voltage Vcc is applied to power supply node NV and voltage level at the node NV attains to a prescribed voltage level or attains to a stable state.

Operation of test mode activating signal generating circuit 100 shown in FIG. 13 will be described with reference to FIG. 14, which is a timing chart thereof.

In a synchronous semiconductor memory device, an operation mode is designated by a combination of states of external signals at a rise of a clock signal CLK. In a clock cycle #a, at a rising edge of clock signal CLK, row address strobe signal ZRAS, column address strobe signal ZCAS and write enable signal ZWE are all set to the L level. This state is referred to as a mode set command, which designates a mode different from the normal operation mode. When the mode set command is applied, a specific address signal bit Add is set to the H level.

When the mode set command is applied, mode set instructing signal MSET is set to and kept at the H level for a prescribed time period, and tristate inverter buffer 100a shown in FIG. 13 operates so that address signal bit Add is inverted and transmitted to internal node NA. The signal transmitted to internal node NA is inverted and transmitted to internal node NB by inverter circuit 100ba, and test mode activating signal TME attains to the H level. In test mode activating signal generating circuit 100b, tristate inverter buffer 100bb operates complementarily to tristate inverter buffer 100a, so that when mode set instructing signal MSET attains to the inactive state of L level, tristate inverter buffer 100bb is set to an operative state, and thus inverter 100ba and tristate inverter buffer 100bb constitute a latch circuit. Test mode activating signal TME is held at the active state of H level.

When test mode activating signal TME is set to the active state of H level in clock cycle #a, the semiconductor memory device enters the test mode (test mode entry). Thereafter, from the next clock cycle #b, a prescribed test operation is performed (test cycle period). In the test cycle period, tristate inverter buffer 100a is at an output high impedance state, tristate inverter buffer 100bb operates as an inverter, and therefore test mode activating signal TME is held at the H level.

When the test operation activated by the test mode activating signal TME is completed in clock cycle #c, the mode set command is again applied in clock cycle #d, and the mode set instructing signal MSET attains to and kept at the H level for a prescribed time period. Tristate inverter buffer 100a is set to an operative state, while tristate inverter buffer 100bb is set to the output high impedance state. Consequently, a signal at the H level is transmitted to internal node NA and, in response, test mode activating signal TME attains to the inactive state of L level. When mode set instructing signal MSET falls to the L level, tristate inverter buffer 100a attains to the output high impedance state, tristate inverter buffer 100bb is set to the operative state and the test mode activating signal TME is held at the L level. Consequently, the test mode is reset and thereafter, operation of another mode is performed.

The above described operation takes place when power supply voltage Vcc is turned on and the power supply voltage Vcc attains a stable state. The operation of test mode activating signal generating circuit 100 at the time of power on will be described.

At the time of power on, tristate inverter buffer 100a is at the output high impedance state, and test mode activating signal generating circuit 100b constitutes a latch circuit. In this state, voltage level of internal node NA in the initial state is determined by the state of the latch circuit (inverter 100ba and tristate inverter buffer 100bb) at the time of power on.

Now, when power supply voltage is turned on at time t0 as shown in FIG. 15, the power supply voltage Vcc on node NV rises gradually. The latch state of test mode activating signal generating circuit 100b is not predictable at the time of power on, and therefore the voltage levels of internal node NA and test mode activating signal TME are not predictable either (in FIG. 15, the voltage levels are shown as gradually rising, by dotted lines). This is because inverter 100ba and tristate inverter buffer 100bb are both in transient region in the initial state, consuming through current, so that output voltage levels thereof are non-predictable.

Until the power supply voltage Vcc attains to a prescribed voltage level at time t1, power on detection signal ZPOR is kept at L level, p channel MOS transistor 102 is rendered conductive in response, and internal node NA is electrically connected to power supply node NV. By the conduction of MOS transistor 102, the voltage level of internal node NA is set to the H level, initial state of the latch state of the test mode activating signal generating circuit 100b is set, internal node NA attains to the H level and internal node NB attains to the L level.

At time t1, even when power on detection signal ZPOR rises to the H level and MOS transistor 102 is rendered non-conductive, voltage levels of internal nodes NA and NB vary because of the latch circuit including inverter 100ba and tristate inverter buffer 100bb, such that internal node NA rises to the H level as the voltage level of power supply voltage Vcc increases, while test mode activating signal TME from node NB falls to the L level as the voltage level of internal node NA rises. Consequently, when the power supply voltage Vcc finally attains to the prescribed voltage level Va, internal node NA attains to the H level corresponding to the level of voltage Va, and test mode activating signal TME is held at the L level which corresponds to the ground level of the ground voltage GND. At the time of power on, the test mode activating signal generating circuit can be reset to a desired initial state, and hence erroneous activation of test mode activating signal TME at the time of power on can be prevented.

FIG. 16 shows an example of a conventional power on detection circuit. Referring to FIG. 16, the power on detection circuit includes a p channel MOS transistor P1 connected between a node S1 and a power supply node NV and having a gate connected to a node S2; a resistance element Z1 having one end connected to node S1; an n channel MOS transistor Q1 connected between the other end of resistance element Z1 and a ground node and having a gate connected to node S2; a coupling capacitance CP1 connected between power supply node NV and node S1; an n channel MOS transistor Q2 connected between node S2 and ground node and having a gate connected to node S1; and a p channel MOS transistor P2 and a resistance element Z2 connected in series between power supply node NV and node S2. The gate of p channel MOS transistor P2 is connected to node S1. A capacitance element CP2 is further provided for stabilizing the voltage level of node S2, between node S2 and the ground node.

The power on detection circuit further includes three stages of cascaded inverters IV1, IV2 and IV3 for receiving and inverting a signal on node S2 for transmission to node S3, a coupling capacitance CP3 connected between node S3 and power supply node NV; an inverter IV4 inverting a signal potential on node S3 for transmission to node S4; and two stages of cascaded inverters IV5 and IV6 for outputting power on detection signal ZPOR in accordance with a signal potential on node S4.

The power on detection circuit further includes a p channel MOS transistor P3 and a resistance element Z3 connected in series between power supply node NV and a node S5. The gate of p channel MOS transistor P3 is connected to node S4.

The power on detection circuit further includes an n channel MOS transistor Q3 connected between node S5 and the ground node and having a gate connected to node S4; a capacitance element CP4 connected between node S5 and the ground node; p channel MOS transistors P4 and P5 connected in series between nodes S5 and S6; an n channel MOS transistor Q4 connected between node S6 and the ground node and having a gate connected to node S4; and an n channel MOS transistor Q5 connected between node S1 and the ground node and having a gate connected to node S6. Each of p channel MOS transistors P4 and P5 has its gate and drain connected, and functions as a voltage lowering element. Operation of the power on detection circuit shown in FIG. 16 will be described with reference to the diagrams of operational waveforms of FIGS. 17 and 18.

Referring to FIG. 17, operation when power on detection signal ZPOR is generated normally will be described. Power is turned on at time t0, and the voltage level of power supply voltage Vcc at power supply node NV rises. As the power is turned on, because of capacitive coupling of capacitance element CP1, the voltage level of node S1 rises in response, n channel MOS transistor Q2 is rendered conductive, and p channel MOS transistor P2 is rendered non-conductive. As n channel MOS transistor Q2 is rendered conductive, node S2 is held at the level of the ground voltage. Consequently, by inverters IV1 to IV3, the voltage level of node S3 rises to the H level in accordance with the level of the power supply voltage. Node S3 has its voltage level reset at the H level at the time of power on because of capacitive coupling of capacitance element CP3, and accordingly, the signal level output to node S4 is set to the L level by inverter IV4, and power on detection signal ZPOR is held at the L level.

While the node S4 is at the L level, p channel MOS transistor P3 is conductive, and in accordance with a time constant defined by resistance element Z3 and capacitance element CP4, the voltage level of node S5 rises moderately. When the voltage level of node S5 exceeds threshold voltages of MOS transistors P4 and P5, the voltage of node S6 begins to rise. When the voltage level of node S6 becomes higher than the threshold voltage of MOS transistor Q5, MOS transistor Q5 is rendered conductive and node S1 is discharged to the L level.

As the voltage level at node S1 lowers, p channel MOS transistor P2 is rendered conductive, and voltage level at node S2 rises in accordance with a time constant determined by resistance element Z2 and capacitance element CP2. As the voltage level of node S2 rises, p channel MOS transistor P1 is rendered non-conductive, and the voltage level of node S1 is surely discharged to the L level. As the voltage level of node S1 lowers, MOS transistor Q2 is rendered non-conductive, and node S2 rises to the H level as the voltage level of power supply voltage Vcc rises. When the voltage level of node S2 exceeds an input logic threshold voltage of inverter IV1, node S3 is discharged and the voltage level thereat is lowered, and in response, the voltage level of node S4 rises. As the level of node S4 rises, power on detection signal ZPOR rises to the H level.

When the voltage level of node S4 rises, p channel MOS transistor P3 is rendered non-conductive, n channel MOS transistors Q3 and Q4 are rendered conductive, nodes S5 and S6 are discharged to the level of the ground voltage and MOS transistor Q5 is rendered non-conductive. As a result, as the voltage level of node S2 rises, MOS transistor Q1 is rendered conductive, and node S1 is held at the L level. By a loop of MOS transistors P2, Q1 and resistance elements Z1 and Z2, node S2 is held at the H level which corresponds to the voltage level of power supply voltage Vcc and, in response, power on detection signal ZPOR is also held at the H level.

From time point t0 when the power is turned on to the time point t1 when power on detection signal ZPOR rises to the H level, power on detection signal ZPOR is at the L level and in this period, internal nodes are reset. More specifically, power on detection signal ZPOR is set to the inactive state of H level when the power supply voltage Vcc attains a prescribed voltage level or a certain voltage level and becomes stable.

Referring to FIG. 18, operation when power on detection signal ZPOR is output imperfectly (with no active state) will be described.

As shown in FIG. 18, power is turned on at time t0 and the voltage level of power supply voltage Vcc increases. The speed of increase of the voltage level of power supply voltage Vcc is moderate. In this case, voltage levels of nodes S1 to S6 are not-defined. Conduction/non-conduction of MOS transistors are not established, speed of increase of voltage levels derived from capacitive coupling of capacitance elements CP1 and CP3 are quite moderate, and internal nodes are not able to shift voltage levels from the undetermined state to the established state. Therefore, in this state, when the voltage level, which is not predictable and non-defined, of internal node S4 is determined to be at the H level, power on detection signal ZPOR output through inverters IV5 and IV6 has its level increased as the voltage level of power supply voltage Vcc increases. When the voltage level of power supply voltage Vcc attains to a prescribed voltage level, voltage levels of those of internal nodes S1 to S6 which have attained to the H level surely increase, and nodes S1 to S6 are driven to prescribed voltage levels respectively.

The voltage level to which each node is driven is determined by the state of conduction/non-conduction of the MOS transistors. In FIG. 18, an operation sequence in which MOS transistor Q1 discharges node S1 to the level of the ground potential as the voltage of node S2 increases, is shown as an example. In this state, node S2 is charged through MOS transistor P2, its voltage level increases to the H level, node S3 is driven to the L level in response, and the voltage of node S4 is driven to the H level. When node S4 is driven to the H level, nodes S5 and S6 are also driven to L level.

Accordingly, in the operation sequence shown in FIG. 18, power on detection signal ZPOR has its voltage level increased in synchronization with the power supply voltage Vcc. Therefore, there is not a period in which power on detection signal ZPOR is held at the L level, and therefore reset operation for holding internal non-predictable nodes at prescribed initial voltages level is impossible.

When the speed of rise of power supply voltage Vcc is slow and power on detection signal ZPOR is generated imperfectly as shown in FIG. 18, the following problem arises.

More specifically, referring to FIG. 19, power is turned on at time t0, and in response, voltage level of power on detection signal ZPOR increases. Meanwhile, nodes NA and NB shown in FIG. 13 have the voltage levels not predictable in the initial state, and the voltage levels are determined by the state of latching of test mode activating signal generating circuit 100b. Therefore, when power on detection signal ZPOR has the voltage level thereof increased in accordance with the power supply voltage Vcc, then MOS transistor 102 is non-conductive and whether the voltage levels of nodes NA and NB assume H level or L level is determined dependent on the voltage levels of nodes NA and NB at that time. Therefore, when the power supply voltage Vcc attains to a prescribed voltage level or higher and the latch circuit of test mode activating signal generating circuit 100b enters the latch state, there are two states, i.e., one in which the signal at node NA attains to the H level and the signal at node NB, that is, test mode activating signal TME attains to the L level, and another in which the voltage level at node NA attains to the L level and test mode activating signal TME attains to the H level.

The test mode activating signal TME at the H level means that test mode is to be performed in the semiconductor memory device, and in normal operation mode, there is a possibility of malfunction.

In a standard DRAM (Dynamic Random Access Memory), a dummy cycle is provided for setting internal signal lines and internal nodes to prescribed initial states. However, what is done in the dummy cycle is simply to toggle the row address strobe signal/RAS several times, which means that only RAS related circuitry (circuitry related to the signal RAS, including circuits related to row selection) operates, and peripheral circuitry including the test mode activating signal generating portion is not reset.

In an SDRAM (Synchronous DRAM), a normal mode set cycle is performed in which special operation modes other than the normal operation mode (operation mode for data reading/writing) are all reset. If such a special normal mode set cycle is prepared, it is possible to reset the erroneously set test mode activating signal TME to the initial state. However, one of the test modes in which operation margin and operation characteristics are tested by externally applying a bias voltage VBB to a semiconductor substrate region, which is referred to as VBB application mode, cannot be reset even by the normal mode set cycle.

FIG. 20 schematically shows a circuit structure for performing VBB application mode. Referring to FIG. 20, the circuit for implementing VBB application mode includes VBB generating circuit 120 which is set to an operative state when test mode activating signal TME is inactive, for generating a bias voltage of a prescribed voltage level, and a selector 122 for selecting bias voltage from VBB generating circuit or an external voltage Ex applied from an external terminal 121 in accordance with test mode activating signal TME. The voltage from selector 122 is applied to a substrate region 123 of the semiconductor memory device. Substrate region 123 is a P type semiconductor substrate region and at the surface of substrate region 123, N type impurity regions 124a and 124b having high concentration are formed apart from each other. Between impurity regions 124a and 124b, a gate electrode layer 125 is formed with a gate insulating film underlaid. Thus one MOS transistor is provided in FIG. 20.

Generally, the substrate region 123 is formed of a well region or an epitaxial layer and a negative bias voltage is applied thereto.

When test mode activating signal TME is inactive, selector 122 selects and applies to substrate region 123 the bias voltage generated by VBB generating circuit 120. When test mode activating signal TME is active, selector 122 selects and applies to substrate region 123, the external voltage Ex applied from external terminal 121. Substrate bias voltage VBB stabilizes threshold voltage of the MOS transistor formed at the surface of the substrate region (transistor consisting of impurity regions 124a and 124b and gate electrode layer 125), and realizes high speed operation by reducing junction capacitance between substrate region 123 and impurity regions 124a and 124b.

The threshold voltage of the MOS transistor is represented as a function of a root of an absolute value of substrate bias voltage VBB. When the absolute value of bias voltage VBB increases, the threshold voltage of the MOS transistor increases. When the absolute value of the bias voltage VBB becomes smaller, the threshold voltage of the MOS transistor becomes smaller.

At the surface of substrate region 123, MOS transistors constituting the semiconductor memory device are formed. At the time of power on, when test mode activating signal TME is activated, selector 122 selects the external voltage Ex at external terminal 121. To external terminal 121, an external control signal (for example, row address strobe signal ZRAS or a column address strobe signal ZCAS) is applied in the normal operation mode. Therefore, at the time of power on, the external voltage Ex is at the ground voltage level or at the voltage level of the power supply voltage Vcc. When the external voltage Ex at the level of the ground voltage is selected and applied to substrate region 123, the threshold voltage of the MOS transistor becomes smaller and the MOS transistor, which is to be off, turns on. Therefore, even if normal mode set cycle is performed in the synchronous semiconductor memory device, internal nodes and internal signal lines cannot be set to the prescribed initial voltage levels as the transistor characteristic is different (which means that internal circuitry does not operate normally but malfunctions), and therefore data cannot be written or read correctly. There is also a possibility that a command decoder for decoding the externally applied normal mode set command does not operate normally, output of the normal mode set signal fails and, eventually, internal resetting is impossible.

When the external voltage Ex of external terminal 121 shown in FIG. 20 is set at the H level, the voltage level corresponds to the level of the power supply voltage Vcc. Therefore, when one of the impurity regions 124a and 124b is connected to the ground node, the substrate region 123 and the impurity region 124a or 124b is biased in forward direction, a large substrate current flows from external terminal 121 through selector 122, substrate region 123 and impurity region 124a or 124b, a larger current flows at a portion, not shown, by a latch up phenomenon caused by the large substrate current, and the semiconductor memory device may possibly run away. Further, it is possible that the large current causes disconnection of a line by heat (electromigration), eventually destroying the memory device.

SUMMARY OF THE INVENTION

An object of the present invention is to prevent the semiconductor memory device from erroneously entering the test mode at the time of power on, even if the power on detection signal is not correctly driven to the active state.

The semiconductor memory device in accordance with a first aspect includes test mode activating signal generating circuitry for activating a test operation mode in accordance with an external signal; power on detecting circuitry coupled to a power supply node, responsive to application of a power supply voltage to the power supply node, for outputting a power on detection signal which is to be kept active for a prescribed time period; and resetting circuitry coupled to the test mode activating signal generating circuitry, responsive to 0 time activation of the power on detection signal for setting the test mode activating signal to an inactive state.

Preferably, the resetting circuitry enables the test mode activating signal generating circuitry in response to activation of the power on detection signal and disables the test mode activating signal generating circuitry when the test mode activating signal is not activated even once.

At the time of power on, when the power on detection signal is not activated at all, the semiconductor memory device can be prevented from erroneously entering the test mode by setting the test mode activating signal inactive. Therefore, in actual use of the semiconductor memory device, malfunction caused by erroneous entrance to the test mode can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
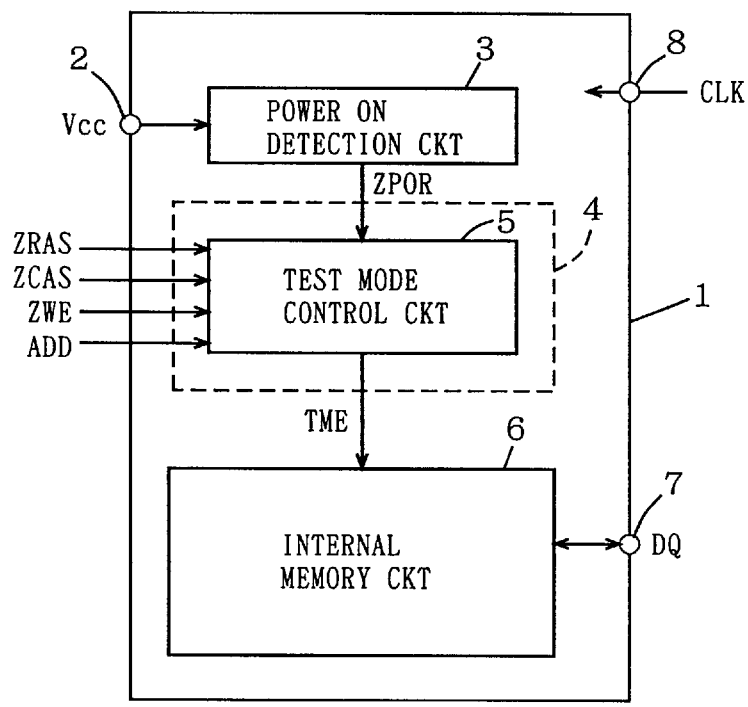
FIG. 1 schematically shows an overall structure of a semiconductor memory device in accordance with a first embodiment of the present invention.

FIG. 1 schematically shows an overall structure of the semiconductor memory device in accordance with a first embodiment of the present invention. Referring to FIG. 1, the semiconductor memory device 1 includes: a power on detection circuit 3 receiving a power supply voltage Vcc applied to a power supply terminal 2, for detecting power on of the semiconductor memory device 1; and a control signal generating circuit 4 having internal node voltages reset by a power on detection signal ZPOR from power on detection circuit 3, and receiving externally applied row address strobe signal ZRAS, column address strobe signal ZCAS, write enable signal ZWE and a prescribed address signal bit ADD for generating internal control signals. In control signal generating circuit 4, test mode control circuit 5 related to the present invention is shown as a representative. Test mode control circuit 5 outputs a test mode activating signal for activating a specific test mode, when external signals ZRAS, ZCAS, ZWE and ADD are set to a prescribed state.

Semiconductor memory device 1 further includes an internal memory circuit 6 performing a prescribed operation under the control of control signal generating circuit 4. In FIG. 1, internal memory circuit 6 is shown to be set to a state for performing a prescribed test mode in accordance with the test mode activating signal TME from test mode control circuit 5. Test mode activating signal TME may designate any test operation mode such as a mode in which an external signal is applied to a specific internal node, or an operation mode in which a plurality of memory cells are selected simultaneously, and in order to realize a specific test operation mode, circuit connection can be switched in internal memory circuit 6 in response to the signal TME.

Internal memory circuit 6 includes memory cells and inputs/outputs data DQ through data input/output terminal 7. Semiconductor memory device 1 also performs data input/output and taking of external signals, in synchronization with a clock signal CLK applied through a clock input terminal 8.

As will be described in greater detail later, test mode control circuit 5 has a function of holding the test mode activating signal TME at the inactive state when power on detection signal ZPOR is not activated at all or when it is in imperfect activation state.

Figure 16:
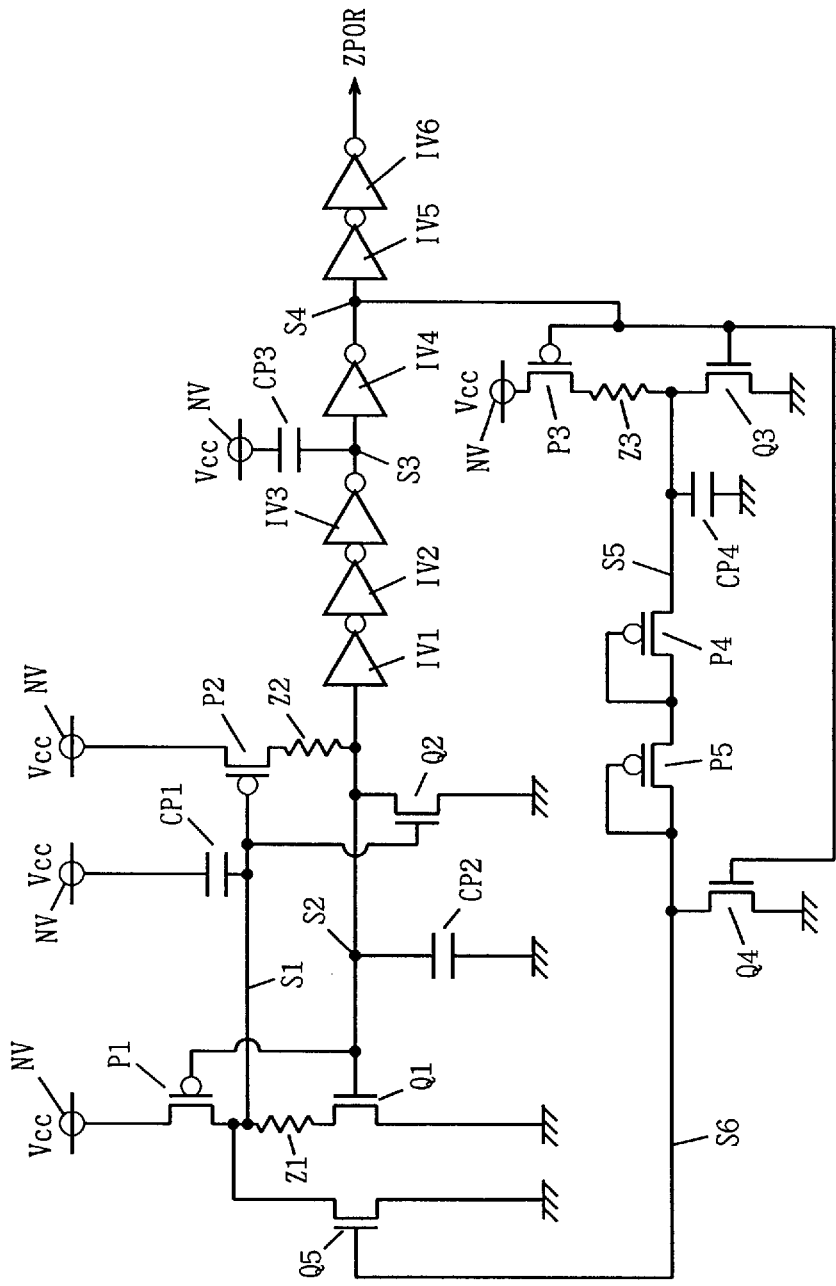
FIG. 16 shows an example of a structure of a conventional power on detection circuit.
Figure 17:
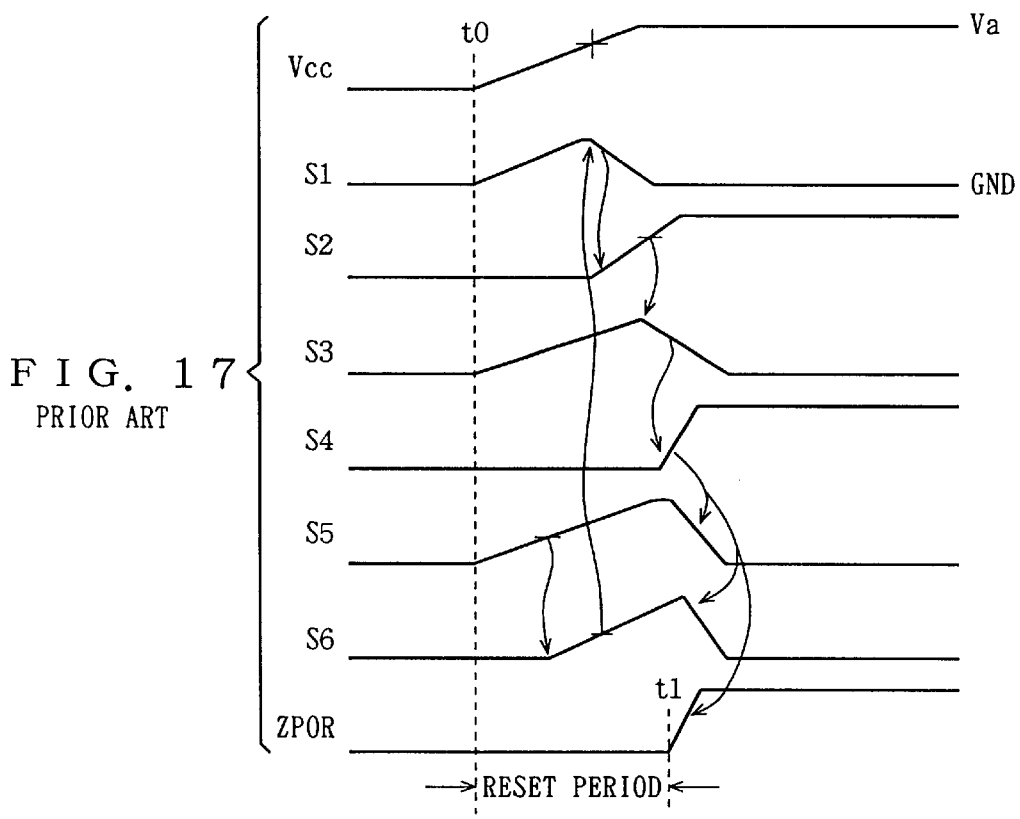
FIG. 17 is a diagram of signal waveforms representing normal operation of the power on detection circuit shown in FIG. 16.
Figure 18:
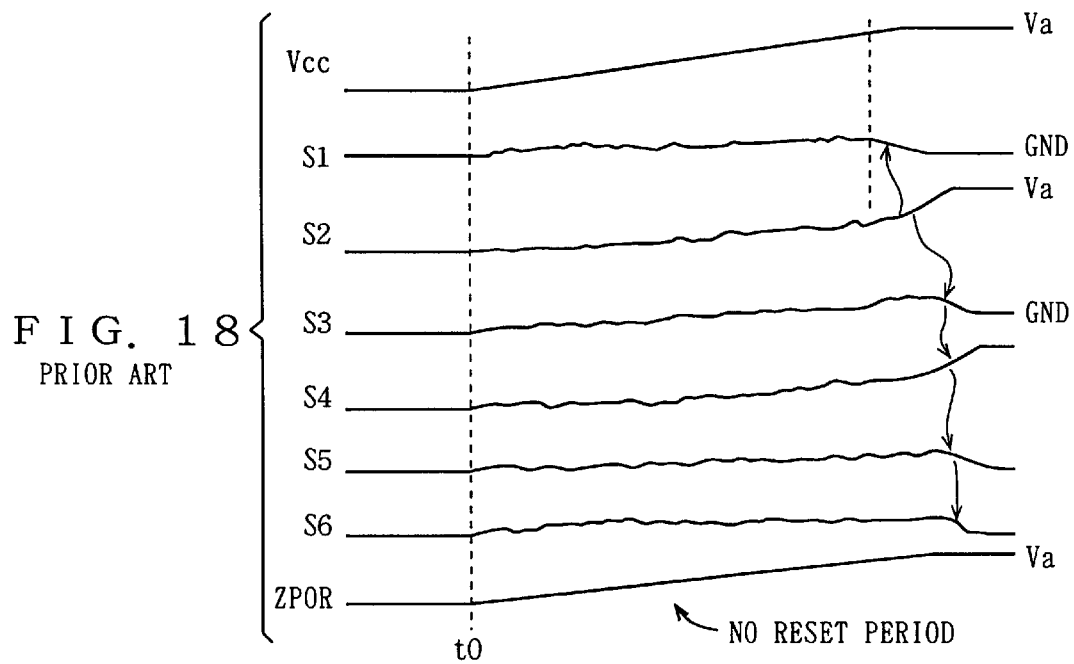
FIG. 18 is a diagram of signal waveforms representing a problematic operation of the power on detection circuit shown in FIG. 16.
Figure 19:
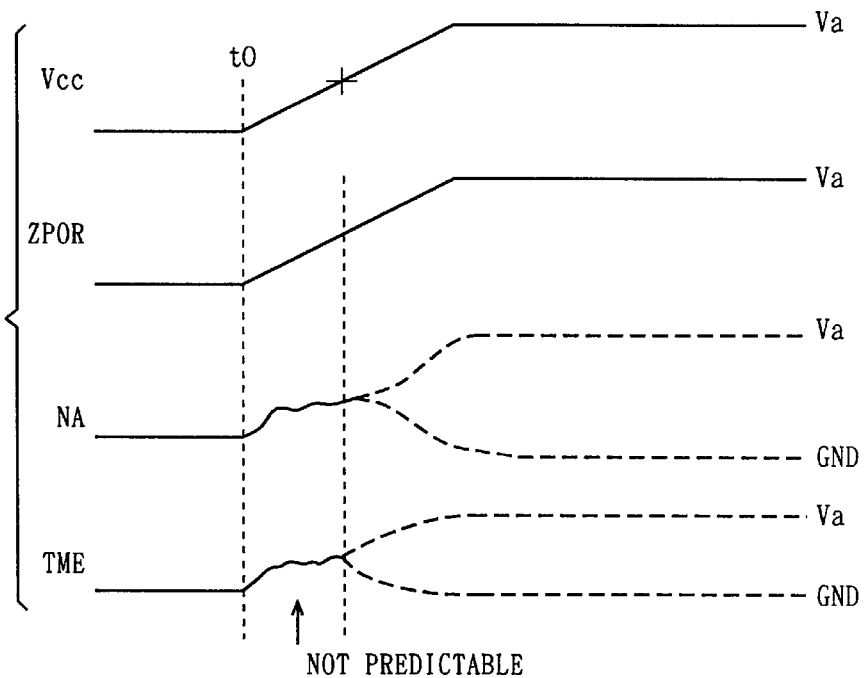
FIG. 19 is a diagram of signal waveforms representing the operation of the test mode activating signal generating circuit corresponding to the waveform diagram of FIG. 18.
Figure 20:
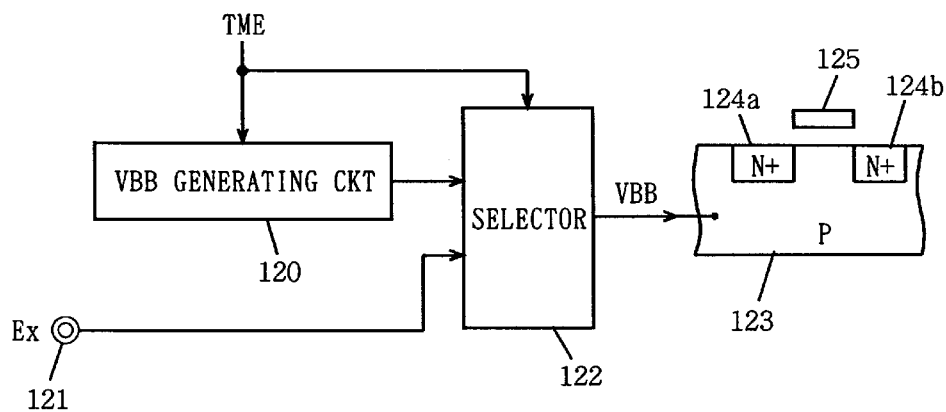
FIG. 20 schematically shows the structure for VBB application mode in the conventional test mode.

Power on detection circuit 3 has similar structure as that shown in FIG. 16 and it outputs a signal which rises to the H level when the power supply voltage Vcc applied to the power supply terminal 2 attains to a prescribed voltage level or higher.

Figure 2:
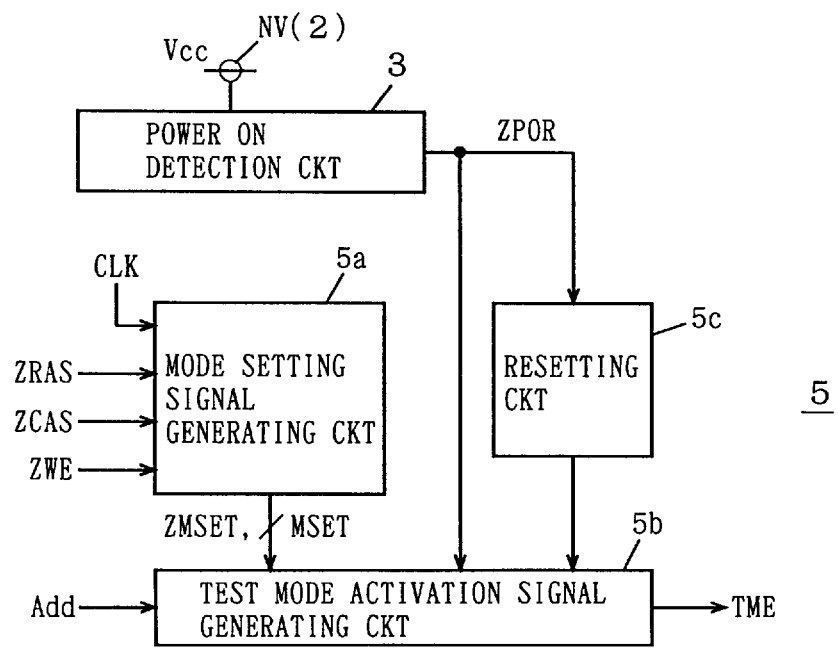
FIG. 2 schematically shows a structure of a test mode control circuit shown in FIG. 1.

FIG. 2 schematically shows a structure of test mode control circuit 5 shown in FIG. 1.

Referring to FIG. 2, test mode control circuit 5 includes: a mode setting signal generating circuit 5a for driving mode setting signals MSET and ZMSET to the active state when external control signals ZRAS, ZCAS and ZWE are set to a prescribed state (L level) at a rising edge of the clock signal CLK; a test mode activating signal generating circuit 5b responsive to activation of mode setting signals MSET and ZMSET from mode setting signal generating circuit 5a for taking in an external specific address signal bit Add and for outputting the test mode activating signal TME; and a resetting circuit 5c for holding the test mode activating signal TME output from test mode activating signal generating circuit 5b inactive when power on detection signal ZPOR from power on detection circuit 3 is not activated at all (zero time activation). Further, test mode activating signal generating circuit 5b resets internal nodes thereof to prescribed initial states in accordance with activation of power on detection signal ZPOR from power on detection circuit 3, and resets the test mode activating signal TME to the initial state of inactive state.

Mode setting signal generating circuit 5a is generally formed by a logic gate which is referred to as a command decoder in a synchronous semiconductor memory device and it outputs a one shot pulse signal when row address strobe signal ZRAS, column address strobe signal ZCAS and write enable signal ZWE are all set to the L level at a rising edge of clock signal CLK.

Figure 3:
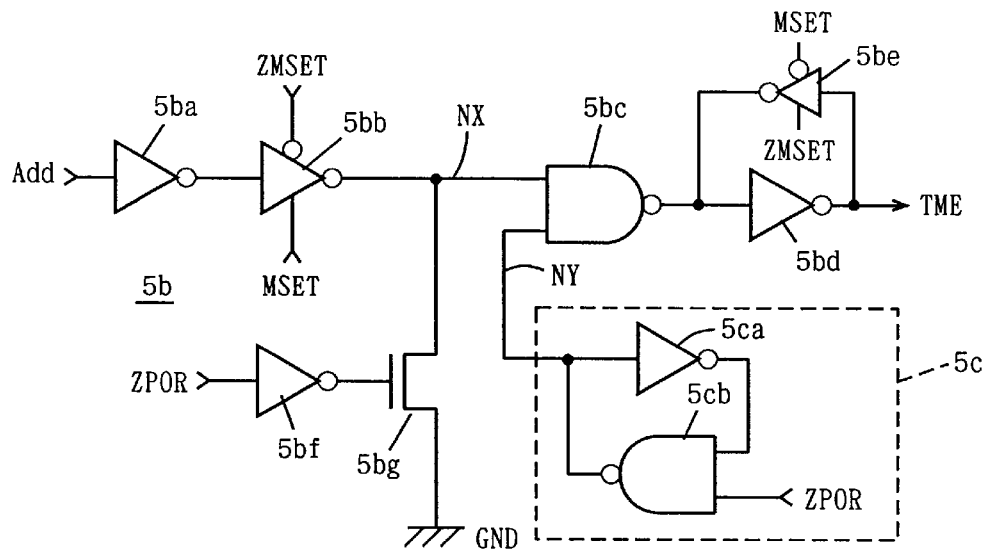
FIG. 3 schematically shows a structure of a test mode activating signal generating circuit shown in FIG. 2.

FIG. 3 shows an example of structures of test mode activating signal generating circuit 5b and resetting circuit 5c shown in FIG. 2. Referring to FIG. 3, test mode activating signal generating circuit 5b includes: an inverter 5ba receiving a specific address signal bit Add; a tristate inverter buffer 5bb which is set to an operative state when mode setting signals MSET and ZMSET are activated, for inverting and transmitting to an internal node NX an output signal from inverter 5ba; an NAND circuit 5bc receiving a signal potential on internal node NX and a signal potential of an internal node NY applied from resetting circuit 5c; an inverter 5b for inverting an output signal from NAND circuit 5bc for outputting test mode activating signal TME; and a tristate inverter buffer 5be which is set to an operative state when mode setting signals MSET and ZMSET are inactivated, for transmitting test mode activating signal TME to an input portion of inverter 5bb. Inverter buffers 5bd and 5be are set to the output high impedance state when inactivated (when in non-operative state).

Test mode activating signal generating circuit 5b further includes an inverter 5bf receiving power on detection signal ZPOR, and an n channel MOS transistor 5bg which is rendered conductive when the output signal from inverter 5bf is at the H level, for electrically connecting internal node NX to the ground node. When power on detection signal ZPOR is at the active state of L level, MOS transistor 5bg is rendered conductive, and internal node NX is reset to the level of the ground voltage GND.

Resetting circuit 5c includes an inverter 5ca receiving a signal on internal node NY, and an NAND circuit 5cb receiving an output signal from inverter 5ca and power on detection signal ZPOR for transmitting an output signal thereof to internal node NY. The details of the structure of resetting circuit 5c will be described later. Transistor size and so on of this circuit are adjusted such that internal node NY is reset to the L level when power on detection signal ZPOR is not activated at all at the time of power on. This is realized by the fact that a latch circuit is formed by inverter 5ca and NAND circuit 5cb and is made to tend to latch internal node NY into the L level when power on detection signal ZPOR is at the H level (as will be described in greater detail later).

Figure 4:
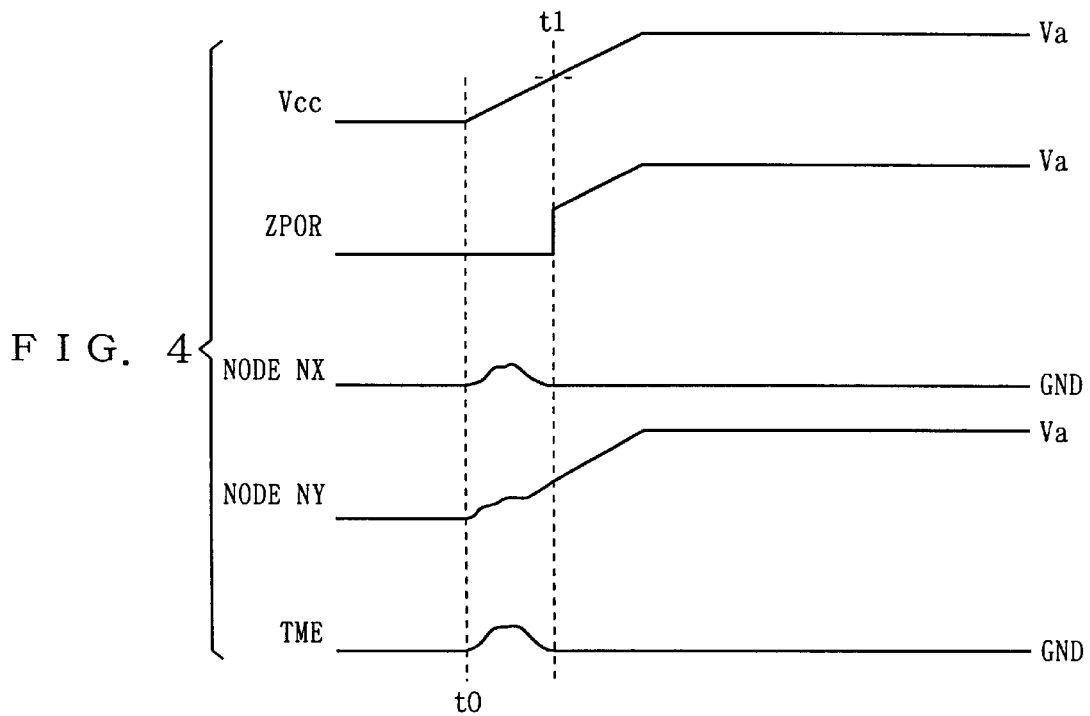
FIG. 4 is a diagram of signal waveforms representing the operation of the test mode activating signal generating circuit shown in FIG. 3.
Figure 5:
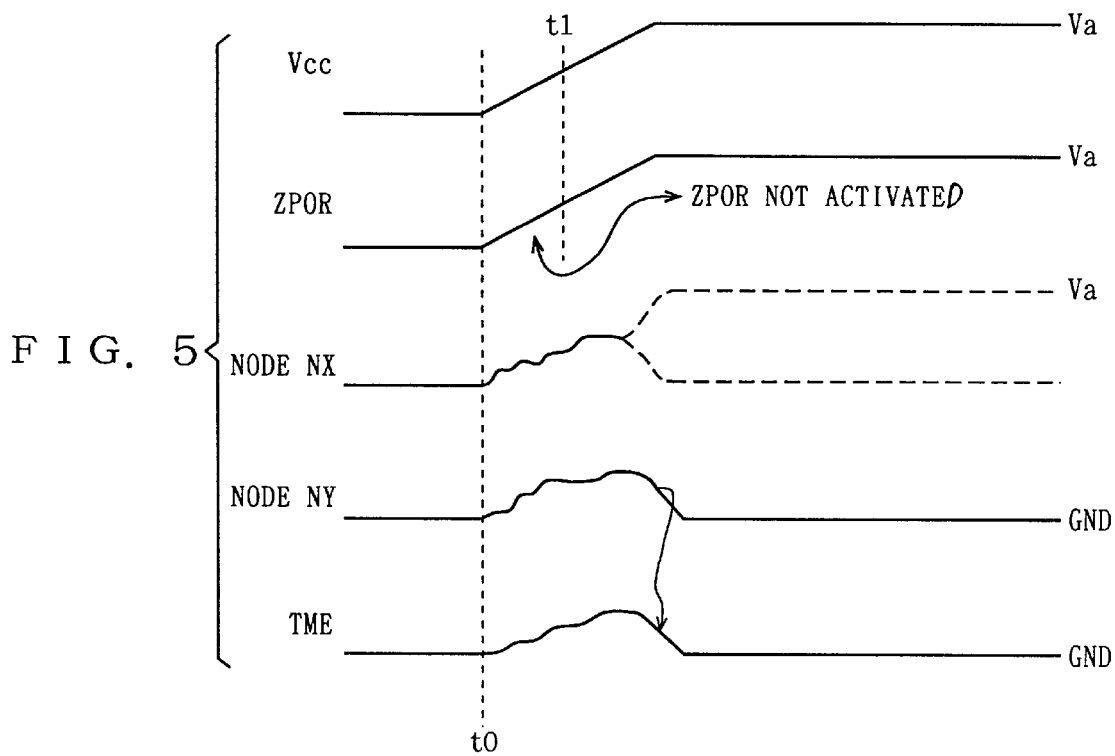
FIG. 5 is a diagram of signal waveforms representing the operation of the test mode activating signal generating circuit shown in FIG. 3.

Operation of test mode activating signal generating circuit 5b and resetting circuit 5c shown in FIG. 3 will be described with reference to the diagrams of waveforms shown in FIGS. 4 and 5.

First, referring to FIG. 4, operation when power on detection signal ZPOR is surely set to the active state will be described. Before power on, internal nodes are all at the L level because of discharging, and similarly internal signals are also at the L level.

At time t0, power is turned on and voltage level of power supply voltage Vcc increases. As the power is turned on, voltage level of power on detection signal ZPOR is held at the L level, which corresponds to the level of the ground voltage. Node NX is at a floating state, as tristate inverter buffer 5bb is inoperative and at an output high impedance state. Similarly, internal node NY has its voltage level non-predictable at the time of power on, since the state of latching of latch circuit in reset circuit 5c is not predictable. In FIG. 4, voltage levels of nodes NX and NY are shown fluctuating, in order to indicate that the levels thereat are not defined. In this state, the voltage level of test mode activating signal TME output from inverter 5bb is not predictable either.

However, as the output signal from inverter 5bf rises as power supply voltage Vcc increases, MOS transistor 5bg is rendered conductive, node NX is reset to the L level and test mode activating signal TME is also reset to the L level in response.

At time t1, when power supply voltage Vcc reaches a prescribed voltage level, power on detection signal ZPOR is driven to the H level. Consequently, the output signal from inverter 5bf attains to the L level, MOS transistor 5bg is rendered non-conductive and resetting of internal node NX is completed. In accordance with the voltage level of internal node NX, output signal of NAND circuit 5bc is set to the H level and has the voltage level thereof increased as the power supply voltage Vcc increases. In response, test mode activating signal TME output from inverter 5bd is held at the inactive state of L level. When test mode activating signal TME is set at the L level, it is latched by inverter 5bd and tristate inverter buffer 5be.

Meanwhile, as output signal from NAND circuit 5cb attains to the H level in response to activation of power on detection signal ZPOR, internal node NY rises to the level of the power supply voltage Vcc. In this state, the output signal from inverter 5ca attains to the L level and the voltage level of internal node NY is set to the H level.

As described above, when voltage levels of internal nodes NX and NY are established from the non-predictable state, internal node NX is fixed at the L level and internal node NY is set to the voltage level of Va even when power on detection signal ZPOR rises to the H level, and therefore test mode activating signal TME is stably held at the L level which corresponds to the level of the ground voltage GND.

If current drivability of MOS transistor 5bg for resetting is set large, it can surely discharge the internal node NX to the level of the ground voltage with high current drivability, even when it is rendered conductive before power supply voltage Vcc reaches the prescribed voltage level Va. Since voltage level of power on detection signal ZPOR rises to the H level, internal node NY reaches the prescribed voltage level Va as the voltage level of power supply voltage Vcc rises, because of the latch circuit (latch circuit formed by inverter 5ca and NAND circuit 5cb).

When power on detection signal ZPOR is deactivated, NAND circuit 5bc functions as an inverter. Therefore, when entering the test mode, the test mode activating signal TME can be generated in accordance with the externally applied address signal Add.

The operation when power on detection signal ZPOR is imperfectly activated will be described with reference to FIG. 5.

At time t0, power is turned on and voltage level of power supply voltage Vcc rises. As the level of power supply voltage Vcc increases, power on detection signal ZPOR also has its voltage level increased, and the output signal from inverter 5bf attains to the L level. As the voltage level of power supply voltage Vcc increases, voltage levels of nodes NX and NY become unstable and indeterminate and voltage levels increase slightly with much fluctuation. This increase in voltage derives from leak current, capacitive coupling and the like. It also derives from instability of the latch state of reset circuit 5c.

At time t1, even when power supply voltage Vcc attains to a prescribed voltage level, power on detection signal ZPOR does not quickly rise but it is at a voltage level similar to that of power supply voltage Vcc. In this state, the potential level of power on detection signal ZPOR is not determined to be L level by inverter 5bf, and therefore the output signal from inverter 5bf is kept at the L level. MOS transistor 5bg is maintained non-conductive, and internal node NX is held at the voltage level not predictable. Therefore, dependent on the floating state, node NX is eventually stabilized to the level of the power supply voltage or the level of the ground voltage (because of leak current or capacitive coupling.

Meanwhile, in resetting circuit 5c, while the power on detection signal ZPOR is maintained inactive, the output signal from NAND circuit 5cb is set to have a tendency to be the L level. Therefore, when power on detection signal ZPOR is output only imperfectly and activation is not performed at all, internal node NY is driven to the L level by the latch circuit consisting of inverter 5ca and NAND circuit 5cb. As the internal node NY is driven to the L level, output signal from NAND circuit 5bc rises to the H level, and test mode activating signal TME from inverter 5bd is driven to the L level. The L level of the test mode activating signal TME is latched by inverter 5bd and tristate inverter buffer 5be.

Therefore, even when power on detection signal ZPOR is not output and the voltage level of internal node NX is not predictable, test mode activating signal TME can surely be held at the inactive state of L level, and therefore internal malfunction of the semiconductor memory device can be prevented.

Figure 6:
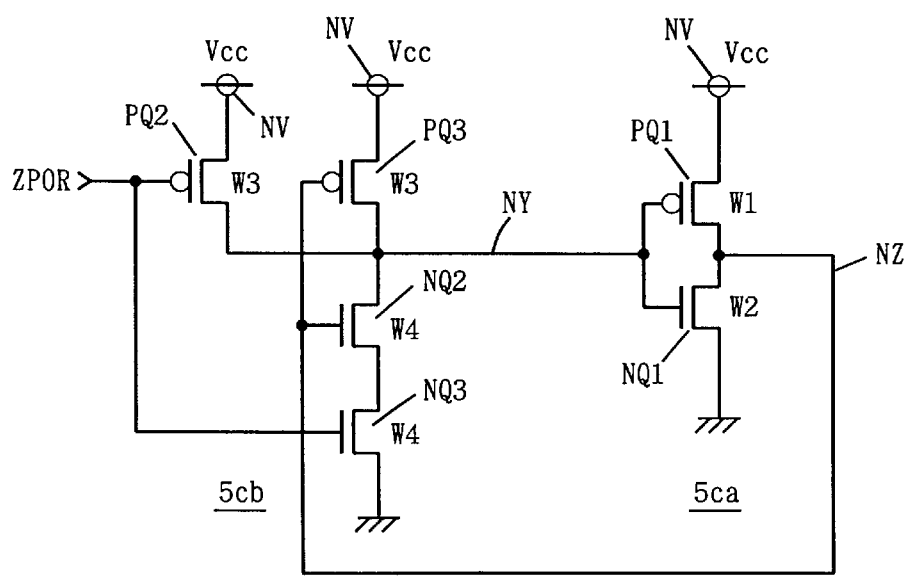
FIG. 6 shows a structure of a resetting circuit shown in FIG. 3 in transistor level.

FIG. 6 schematically shows relation between sizes of transistors which are components of inverter 5ca and NAND circuit 5cb included in resetting circuit 5c shown in FIG. 3.

Referring to FIG. 6, inverter 5ca includes a p channel MOS transistor PQ1 connected between power supply node NB and internal node NZ and having its gate connected to internal node NY, and an n channel MOS transistor NQ1 connected between internal node NZ and the ground node and having its gate connected to internal node NY. The size W1 (ratio of gate width to gate length W/L, represented by the letter W in the figure) of p channel MOS transistor PQ1 is set larger than size W2 of n channel MOS transistor NQ1. Therefore, inverter 5ca tends to drive internal node NZ to the H level at the time of power on.

NAND circuit 5cb includes a p channel MOS transistor connected between power supply node NV and internal node NY and receiving at its gate power on detection signal ZPOR, a p channel MOS transistor PQ3 connected between power supply node NB and internal node NY and having its gate connected to internal node NZ, and n channel MOS transistors NQ2 and NQ3 connected in series between internal node NY and the ground node.

The gate of n channel MOS transistor NQ2 is connected to internal node NZ, and to the gate of n channel MOS transistor NQ3, power on detection signal ZPOR is applied. The size W3 of p channel MOS transistors PQ2 and PQ3 is set smaller than the size W4 of n channel MOS transistors NQ2 and NQ3. The size W4 of n channel MOS transistors NQ2 and NQ3 is made larger than the size of p channel MOS transistor PQ1, and current drivability of n channel MOS transistors NQ2 and NQ3 is set higher than that of p channel MOS transistor PQ1. NAND circuit 5cb tends to drive internal node NY to the L level by n channel MOS transistors NQ2 and NQ3 having higher current drivability, at the time of power on. The operation will be briefly described in the following.

Assume that the voltage level of internal node NY is not predictable at the time of power on and fluctuates. In this state, MOS transistors PQ1 and NQ1 in inverter circuit 5ca are both rendered conductive (weakly conductive), and supply current. Current drivability of p channel MOS transistor PQ1 is higher than that of n channel MOS transistor NQ1, and voltage level of internal node NZ tends to be driven to the H level.

Meanwhile, in NAND circuit 5cb, when power on detection signal ZPOR is maintained inactive, power on detection signal ZPOR has its voltage level increased as the power supply voltage Vcc increases. Therefore, n channel MOS transistor NQ3 is rendered conductive and p channel MOS transistor PQ2 is rendered non-conductive. Meanwhile, since the voltage level of internal node NZ tends to be driven to the H level, p channel MOS transistor PQ3 is set such that it is rendered weakly non-conductive. Therefore, internal node NY tends to be driven to the L level. When power on detection signal ZPOR attains to a prescribed voltage level or higher, drivability of MOS transistor NQ3 increases and discharges internal node NY to the level of the ground potential. Thereafter, MOS transistor PQ1 is rendered conductive, driving internal node NZ to the H level. Consequently, latch state of the inverter 5ca and NAND circuit 5c is established, so that internal node NY attains to the L level corresponding to the level of the ground voltage and internal node NZ attains to the H level corresponding to the level of the power supply voltage Vcc.

When power on detection signal ZPOR is set to the active state, MOS transistor NQ3 is rendered non-conductive, MOS transistor PQ2 is rendered conductive, current is supplied from power supply node NV to internal node NY, and voltage level of internal node NY is driven to the H level. Consequently, the output signal of inverter 5ca falls to the L level, MOS transistor PQ3 is rendered conductive in response, and the voltage level of internal node NY is further driven to the H level at high speed. When power on detection signal ZPOR is set to the inactive state of H level, H level at internal NY is surely latched by NAND circuit 5cb and inverter 5ca.

As described above, in accordance with the first embodiment of the present invention, when power on detection signal is set to the non-predictable state immediately after power on, when it is generated imperfectly with the active period being too short, or when there is not an active state at all, test mode activating signal is kept inactive. Therefore, even when power on detection signal is not surely driven to the active state at the time of power on, it is possible to prevent the semiconductor memory device from entering the test mode, and therefore malfunction of the semiconductor memory device can be prevented.

[Second Embodiment]

Figure 7:
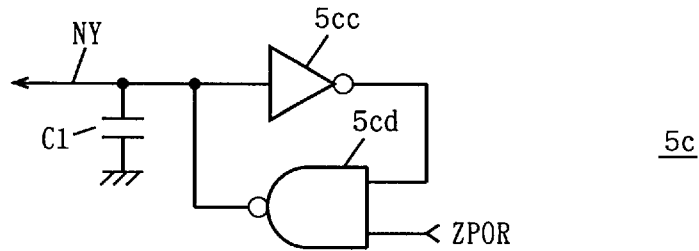
FIG. 7 schematically shows a structure of a resetting circuit in accordance with a second embodiment of the present invention.

FIG. 7 shows a structure of the resetting circuit in accordance with the second embodiment of the present invention. Referring to FIG. 7, resetting circuit 5c includes an inverter 5cc for inverting a signal on internal node NY, and an NAND circuit 5cd receiving an output signal of inverter 5cc and power on detection signal ZPOR. An output signal from NAND circuit 5cd is transmitted to internal node NY. Transistor sizes of inverter 5cc and NAND circuit 5cd are not particularly adjusted. When power on detection signal ZPOR is at the H level, a common inverter latch is formed.

Resetting circuit 5c further includes a capacitance element C1 connected between internal node NY and the ground node. Capacitance element C1 functions as a stabilizing capacitance with respect to internal node NY. Even when voltage level of internal node NY is not predictable and it floats up at the time of power on, increase in the voltage level on internal node NY is suppressed by capacitance element C1, and then internal node NY strongly tends to be driven to the L level. Therefore, when activation of power on detection signal ZPOR sufficient for resetting is not performed at all, the voltage level of internal node NY is surely latched at the L level by the latch circuit consisting of inverter 5cc and NAND circuit 5cd in accordance with the initially set L level.

Capacitance value of capacitance element C1 is set not so large. When power on detection signal ZPOR is activated, capacitance element C1 is surely charged, and internal node NY is surely held at the H level. When a capacitance element is used as shown in FIG. 7, it is not necessary to adjust sizes of transistor elements, the tendency of internal node NY to be driven to the L level can be strengthened easily, and when power on detection signal is not generated (zero time activation), internal node NY can surely be held at the L level. Here, "zero time activation" means that it is not held active for a period sufficient for resetting.

[Third Embodiment]

Figure 8:
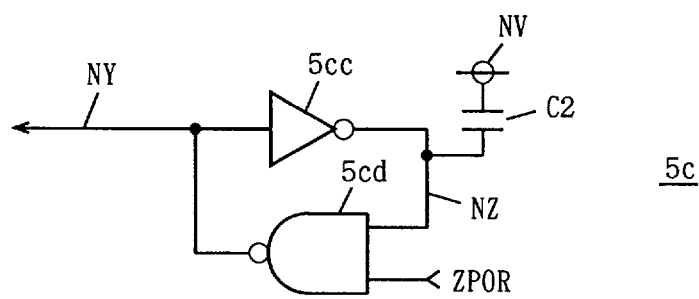
FIG. 8 schematically shows a structure of a resetting circuit in accordance with a third embodiment of the present invention.

FIG. 8 schematically shows a structure of resetting circuit 5c in accordance with a third embodiment of the present invention. In the structure shown in FIG. 8, a capacitance element C2 is coupled between an output node NZ of inverter 5cc and power supply node NV. Capacitance element C2 functions as a coupling capacitance and as power supply voltage Vcc on power supply node NV increases at the time of power on, voltage level of internal node NZ also increases because of the capacitive coupling of capacitance element C2. Therefore, internal node NZ strongly tends to be driven to the H level and in case of zero time activation of power on detection signal ZPOR, it is possible to hold the output signal from NAND circuit 5cd surely at the L level.

Therefore, in the structure shown in FIG. 8 also, by simply using a capacitance element as a coupling capacitance to strengthen the tendency of internal node NZ to be driven to the H level, internal node NY can be held at the L level easily when power on detection signal ZPOR is not generated, without any complicated process such as adjustment of transistor sizes. The capacitance value of capacitance element C2 is determined appropriately and when power on detection signal ZPOR is activated, one electrode node (which is connected to node NZ) of capacitance element C2 is driven to the L level by inverter 5cc as the potential at node NY rises. The L level is held by inverter 5cc and NAND gate 5cd.

[Fourth Embodiment]

Figure 9:
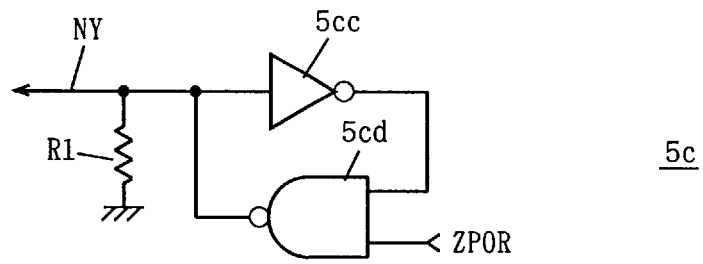
FIG. 9 schematically shows a structure of a resetting circuit in accordance with a fourth embodiment of the present invention.

FIG. 9 shows a structure of the resetting circuit in accordance with a fourth embodiment of the present invention. In the structure shown in FIG. 9, a resistance element R1 having a relatively large resistance value for pulling down is connected between internal node NY and the ground node. Except for this point, the structure is similar to those shown in FIGS. 7 and 8.

In the structure shown in FIG. 9, by pull down resistance element R1, internal node NY is driven to the L level. Therefore, internal node NY is fixed at the L level unless the output signal from NAND circuit 5cd is driven to the H level. When power on detection signal ZPOR is at the L level, internal node NY is driven to the H level by NAND circuit 5cd as the power supply voltage Vcc increases. At this time, internal node NY is held at the H level, by inverter 5cc and NAND circuit 5cd.

As shown in FIG. 9, by connecting a pull down resistance element having a high resistance value to internal node NY, it is possible to drive internal node NY to the L level when power on detection signal ZPOR is not generated, without any complicated designs such as adjustment of transistor sizes.

[Fifth Embodiment]

Figure 10:
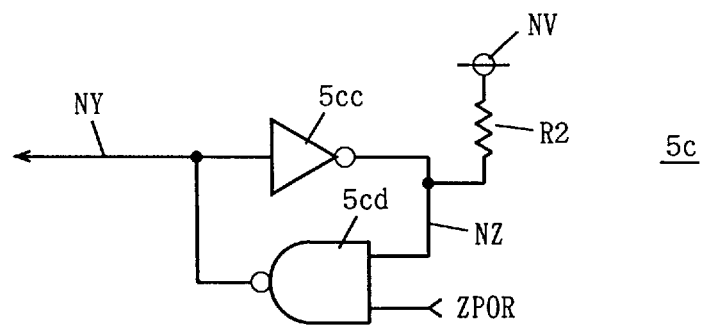
FIG. 10 schematically shows a structure of a resetting circuit in accordance with a fifth embodiment of the present invention.

FIG. 10 schematically shows a structure of the resetting circuit in accordance with a fifth embodiment of the present invention. In resetting circuit 5c shown in FIG. 10, a resistance element R2 having a high resistance value is connected between output node NZ of inverter 5cc and the power supply node NV. Except for this point, the structure is similar to those shown in FIGS. 7 to 9, and corresponding portions are denoted by the same reference characters.

Resistance element R2 functions as a pull up resistance. Therefore, when power on detection signal ZPOR is activated zero times, the internal node NZ is driven to the H level in accordance with the voltage level of power supply voltage Vcc. Output signal from NAND circuit 5cd attains to the L level, and the voltage level of internal node NY is kept at the L level which corresponds to the level of the ground voltage.

When power on detection signal ZPOR is activated, the output signal of NAND circuit 5cd attains to the H level, and, in response, the output signal from inverter circuit 5cc attains to the L level. The resistance value of resistance element R2 is sufficiently large, so that internal node NZ is held at the L level by inverter 5cc and, accordingly, the output signal of NAND circuit 5cd is maintained at H level.

Therefore, in the structure shown in FIG. 10 also, by connecting a pull up resistance element R2 to the output node of the inverter, it is possible to hold internal node NY at the L level when power on detection signal ZPOR is not generated (zero time activation) easily, without any complicated process such as adjustment of transistor sizes.

[Sixth Embodiment]

Figure 11:
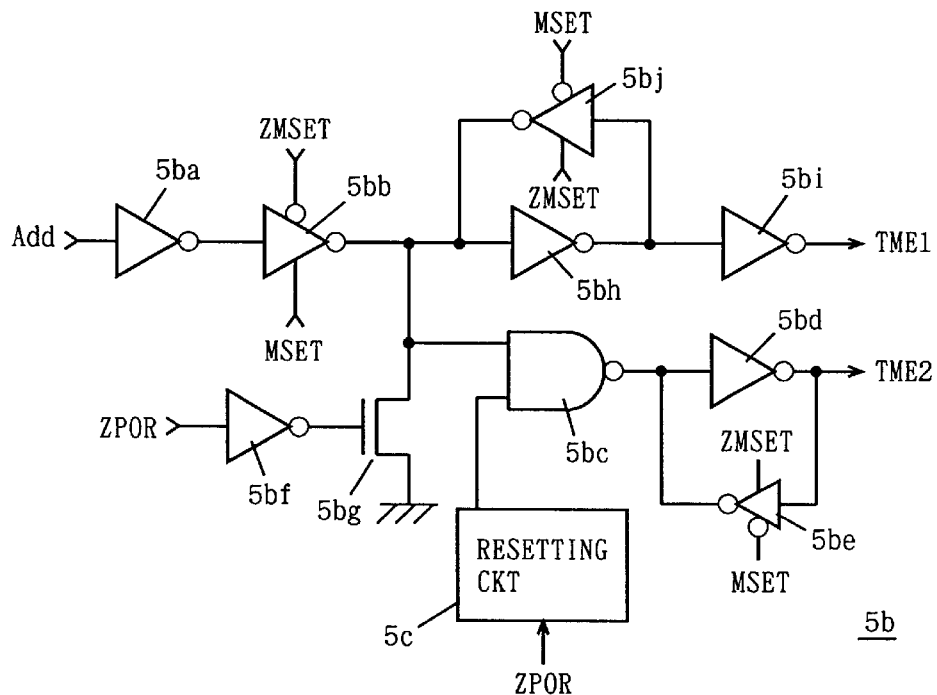
FIG. 11 schematically shows a structure of a test mode activating signal generating circuit in accordance with a sixth embodiment of the present invention.

FIG. 11 schematically shows a structure of test mode activating signal generating circuit 5b in accordance with the sixth embodiment of the present invention. In addition to the structure of FIG. 3, the test mode activating signal generating circuit 5b shown in FIG. 11 further includes an inverter 5bh receiving an output signal from tristate inverter buffer 5bb, an inverter 5bi inverting an output signal from inverter 5bh for generating a first test mode activating signal TME1, and a tristate inverter buffer 5bj which is set to an operative state when mode setting instructing signals MSET and ZMSET are inactive, for inverting an output signal from inverter 5bh for transmission to an input portion of inverter 5bh. Inverter 5bd outputs a second test mode activating signal TME2.

Test mode activating signals TME1 and TME2 activate mutually different test modes. First test mode activating signal TME1 defines a common test mode such as a multibit test mode. Meanwhile, the second test mode activating signal TME2 designates a test mode in which transistor characteristics are completely made different, such as VBB application mode. The first test mode activating signal defining the common test mode is reset to the inactive state in the normal mode set cycle. As for the second test mode activating signal TME2, even when normal mode set cycle is performed, there is some possibility that the normal mode set cycle designating signal is not output, failing to reset the second test mode activating signal, since internal transistor characteristics have been changed. Therefore, in that case, resetting circuit 5c is used, and the second test mode activating signal TME2 is held at the inactive state when power on detection signal ZPOR is not activated at all. Meanwhile, when power on detection signal ZPOR is not activated at all and test mode activating signal TME1 is held active, it is reset in accordance with the normal mode set cycle, which will be described later.

Figure 12:
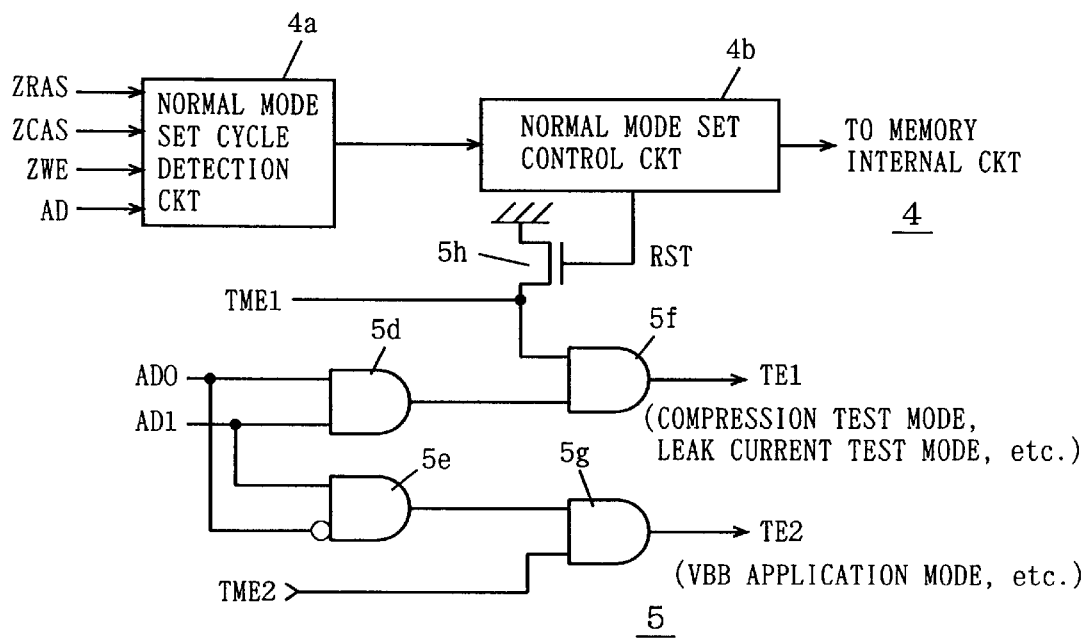
FIG. 12 schematically shows a structure of a test mode control circuit used in combination with the test mode activating signal shown in FIG. 11.
Figure 13:
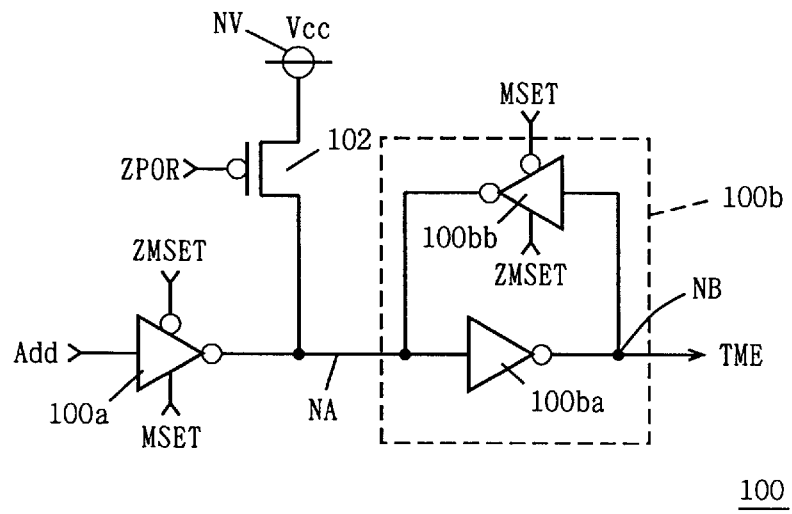
FIG. 13 schematically shows a structure of a conventional test mode activating signal generating circuit.
Figure 14:
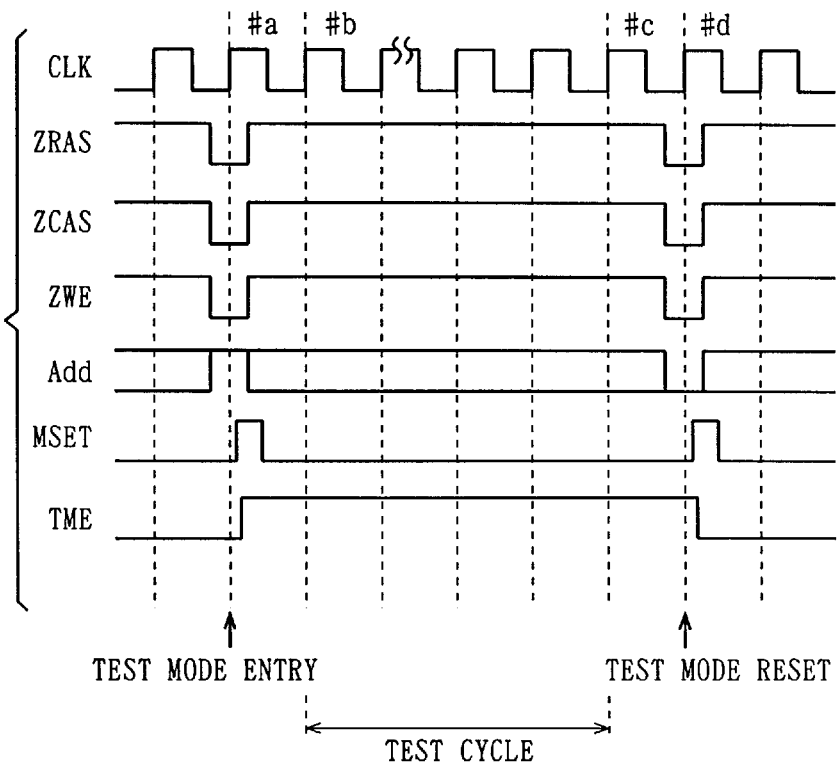
FIG. 14 shows a test mode setting sequence in a conventional semiconductor memory device.
Figure 15:
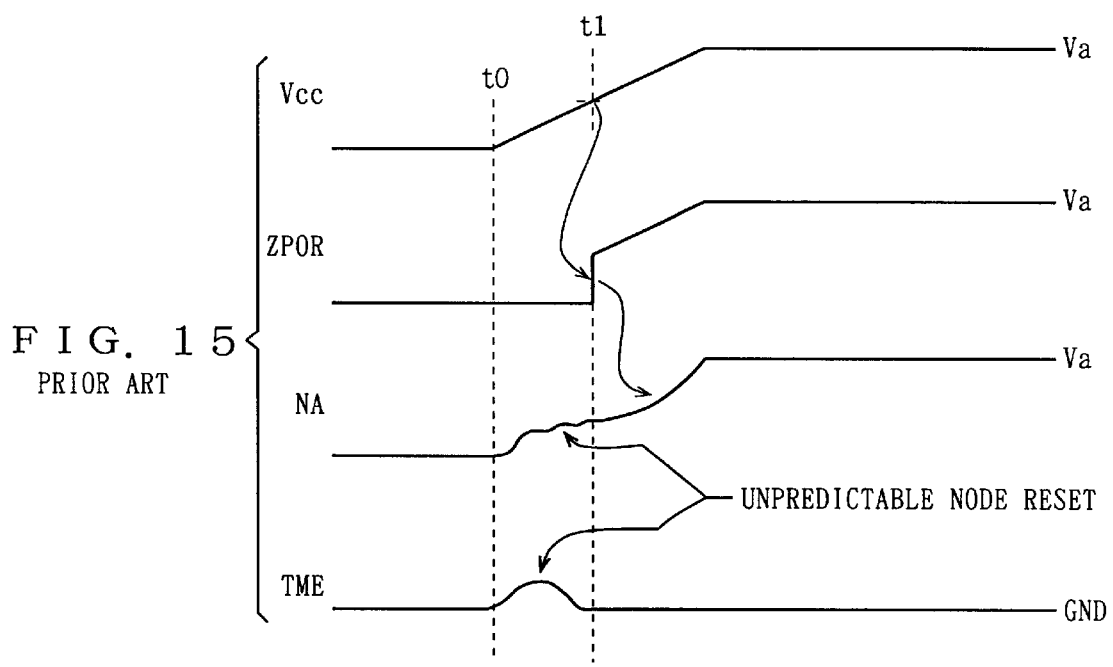
FIG. 15 is a diagram of signal waveforms representing the operation at the time of power on of the test mode activating signal generating circuit shown in FIG. 13.

FIG. 12 schematically shows a structure of a portion related to the test operation of control signal generating circuit shown in FIG. 1. Referring to FIG. 12, control signal generating circuit 4 includes a normal mode set cycle detecting circuit 4a receiving externally applied control signals ZRAS, ZCAS and ZWE and a specific address signal bit AD, for detecting, when these signals are set to a predetermined state at a rising edge of a clock signal (not shown), that a normal mode set instruction is applied, and a normal mode set control circuit 4b for performing normal mode set operation in accordance with a normal mode set cycle detection signal from normal mode set cycle detecting circuit 4a. Normal mode set cycle detecting circuit 4a has a similar structure as mode setting signal generating circuit described previously, and it determines whether the normal mode set cycle has been instructed or not in accordance with the specific address signal bit AD, in response to the mode set instruction. Normal mode set control circuit 4b causes the similar operation of internal circuitry as in a dummy cycle performed in a standard DRAM, in accordance with the normal mode set instruction, and resets a special mode instruction signal such as the test instruction signal, to a prescribed state.

Test mode control circuit 5 included in control signal generating circuit 4 includes, in addition to mode setting signal generating circuit 5a, test mode activating signal generating circuit 5b and resetting circuit 5c shown in FIG. 2, a gate circuit 5d receiving specific address signal bits AD0 and AD1, a gate circuit 5e provided parallel to gate circuit 5d and receiving address signal bits AD0 and AD1, a gate circuit 5f receiving the first test mode activating signal TME1 and an output signal from gate circuit 5a, a gate circuit 5g receiving an output signal from gate circuit 5e and the second test mode activating signal TME2, and a reset transistor (n channel MOS transistor) 5h which is rendered conductive in accordance with the normal mode set signal from normal mode set control circuit 4b for driving the first test mode activating signal TME1 to the inactive state (L level).

Gate circuit 5d outputs a signal at the H level when address signal bits AD0 and AD1 are both at the H level. Gate circuit 5e outputs a signal at the H level when signal bit AD0 is at the L level and address signal bit AD1 is at the H level. Gate circuits 5f and 5g output signals at H level when signals applied to both inputs are at H level. Test mode instruction signal TE1 instructing an operation mode in which internal transistor characteristics are not changed, such as compression test mode and leak current test mode, is output from gate circuit 5f. The test mode instruction signal TE2 for designating a mode in which bias voltage is changed, such as VBB application mode, is output from gate circuit 5g.

In the structure of the test resetting circuit shown in FIG. 12, there is a possibility that the first test mode activating signal TME1 is activated while the power on detection signal is not activated. Meanwhile, the second test mode activating signal TME2 is held inactive, as is apparent from the structure shown in FIG. 11. In this case, by normal mode set cycle detection circuit 4a and normal mode set control circuit 4b, reset signal RST is driven to the active state in the normal mode set cycle time, reset transistor 5h is rendered conductive and test mode activating signal TME1 is driven to the inactive state. Therefore, when actually incorporated in a system for a practical use, it is possible to surely prevent the semiconductor memory device from entering the test mode when the power on detection signal is not driven to the active state, as the normal mode set cycle is performed after power on.

The address signal bits applied to gate circuits 5d and 5e by test mode control circuit shown in FIG. 12 are only an example and a plurality of bits other than those mentioned above may be applied. Further, address signal bits AD0 and AD1 applied to gate circuits 5d and 5g may be taken in, as shown in FIG. 2, in accordance with mode setting signals MSET and ZMSET from mode setting signal generating circuit 5a.

In the test mode operation before shipment of the products, when power on detection signal ZPOR is not activated, test mode activating signal TME2 is always held at the inactive state. In that case, power is again turned on, so as to activate the power on detection signal.

As described above, test mode activating signal TME can surely be reset so as to prevent failure of detection of normal mode set cycle by normal mode set cycle detection circuit 4a or failure of normal mode set operation by normal mode set control circuit 4b resulting from variation of transistor characteristics caused by the change in bias voltage VBB. Therefore, it is possible to reset test mode activating signal TME1 by the normal mode set cycle.

[Other Applications]

Though a synchronous semiconductor memory device has been described above, the present invention is similarly applicable to a standard DRAM having a circuit node which is set to the electrically floating state when a test mode is designated by WCBR (WE, CAS before RAS) condition and an address key and the test mode activating signal is generated. The WCBR condition here refers to a timing condition in which write enable signal ZWE and column address strobe signal ZCAS are set to the L level before the fall of row address strobe signal ZRAS, and the address key refers to a state in which specific address signal bit (1 bit or plural bits) is set to a predetermined logic state.

The present invention is also applicable to other semiconductor memory devices (for example, static random access memory) provided that a node, of which voltage level at the time of power on is set to a prescribed state in accordance with activation of power on detection signal, is reset at the time of power on, is used.

As described above, according to the present invention, when power on detection signal is not driven to the active state at all at the time of power on, the test mode activating signal is held inactive. Therefore, when used in an actual system, malfunction caused by failure of power on detection signal can be prevented, so that highly reliable semiconductor memory device is provided and, accordingly, a highly reliable memory system can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

test mode activating signal generating means for generating a test mode activating signal designating a specific test operation mode in accordance with an external signal;

power on detection means coupled to a power supply node, for outputting a power on detection signal which is to be kept active for a prescribed time period in response to application of power supply voltage to said power supply node; and initializing means coupled to said test mode activating signal generating means and said power on detecting means, responsive to zero time activation of said power on detection signal, for setting said test mode activating signal to an inactive state.

2. The semiconductor memory device according to claim 1, wherein
said initializing means includes means coupled to said test mode activating signal generating means and said power on detecting means, for enabling said test mode activating signal generating means in response to activation of said power on detection signal, and for disabling said test mode activating signal generating means when said power on reset signal is not activated at all.

3. The semiconductor memory device according to claim 1, wherein
said test mode activating signal generating means includes
reset means responsive to activation of said power on detection signal for resetting said test mode activating signal to the inactive state, and said initializing means includes
holding means responsive to the zero time activation of said power on detection signal for holding said test mode activating signal at the inactive state.

4. The semiconductor memory device according to claim 1, wherein
said test mode activating signal generating means includes
test mode signal transmitting means for transmitting a mode specifying signal specifying said test mode to an internal node in accordance with the external signal, and
mode signal output means for generating said test mode activating signal in accordance with the signal on said internal node; and
reset means responsive to activation of said power on detection signal for resetting said internal node to an initial state of a prescribed voltage level, and
said initializing means includes
holding means including latch means for latching a signal corresponding to said power on detection signal, for selectively enabling or disabling said mode signal output means in accordance with the latching signal, said holding means including means for setting, in response to zero time activation of said power on detection signal, said latching signal to a logic level signal setting said mode signal output means to the disable state.

5. The semiconductor memory device according to claim 4, wherein
said latch means includes
a logic gate receiving at a first input said power on detection signal, and
an inverter for inverting a signal at an output node of said logic gate for transmission to a second input of said logic gate, said mode signal output means being selectively enabled or disabled in accordance with a signal at an output node of said logic gate.

6. The semiconductor memory device according to claim 5, wherein
said logic gate and said inverter have sizes of transistors as their components adjusted such that a signal setting said mode signal output means to the disabled state is output at said output node, at the time of zero time activation of said power on detection signal.

7. The semiconductor memory device according to claim 5, wherein
said holding means includes a capacitance element coupled between said output node and a reference node of a prescribed voltage level.

8. The semiconductor memory device according to claim 5, wherein
said holding means further includes a capacitance element coupled between the output of said inverter and a reference node supplying a prescribed voltage.

9. The semiconductor memory device according to claim 5, wherein
said holding means further includes a resistance element coupled between said output node and a reference node transmitting a prescribed voltage.

10. The semiconductor memory device according to claim 5, wherein
said holding means further includes a resistance element coupled between the output of said inverter and a reference node transmitting a reference voltage of a prescribed voltage level.

11. The semiconductor memory device according to claim 1, wherein
said specific test operation mode causes a level of an internal voltage at a prescribed voltage level in a normal operation mode of said semiconductor memory device to be changed.

12. The semiconductor memory device according to claim 11, wherein
said internal voltage of said predetermined voltage level is a substrate bias voltage applied to a substrate region of said semiconductor memory device.

13. The semiconductor memory device according to claim 1, further comprising
means for outputting another test signal for activating a test mode different from said specific test operation mode, in accordance with said external signal.

14. The semiconductor memory device according to claim 13, further comprising,
mode detecting means receiving said external signal and responsive thereto for detecting that a particular operation mode is designated, and
mode control means coupled to said mode detecting means and responsive to said mode detecting means detecting the designation of said particular operation mode for initializing said another signal into an inactive state.

15. The semiconductor memory device according to claim 14, wherein said means for outputting is isolated from said initializing means.

16. The semiconductor memory device according to claim 14, wherein said mode control means initializes internal circuitry in said particular operation mode.

* * * * *